United States Patent
Nakamura

(10) Patent No.: US 11,322,403 B2
(45) Date of Patent: May 3, 2022

(54) WAFER PROCESSING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 10 days.

(21) Appl. No.: 16/522,263

(22) Filed: Jul. 25, 2019

(65) Prior Publication Data

US 2020/0043788 A1    Feb. 6, 2020

(30) Foreign Application Priority Data

Jul. 31, 2018    (JP) .............................. JP2018-143321

(51) Int. Cl.

| | |
|---|---|
| H01L 21/02 | (2006.01) |
| H01L 21/683 | (2006.01) |
| H01L 21/78 | (2006.01) |
| B23K 26/02 | (2014.01) |
| B23K 26/53 | (2014.01) |
| H01L 21/768 | (2006.01) |
| H01L 21/304 | (2006.01) |

(52) U.S. Cl.
CPC .............. *H01L 21/78* (2013.01); *B23K 26/02* (2013.01); *B23K 26/53* (2015.10); *H01L 21/304* (2013.01); *H01L 21/6836* (2013.01); *H01L 21/76894* (2013.01); *H01L 2221/68327* (2013.01); *H01L 2223/54453* (2013.01)

(58) Field of Classification Search
CPC ................ H01L 21/78; H01L 21/6836; H01L 2221/68327; H01L 2221/68336; H01L 2221/6834; H01L 2924/3512; H01L 21/6835

See application file for complete search history.

(56) References Cited

U.S. PATENT DOCUMENTS

| | | | |
|---|---|---|---|
| 7,598,156 B2 * | 10/2009 | Nakamura | B28D 5/0011 438/462 |
| 7,915,140 B2 * | 3/2011 | Genda | H01L 21/78 438/462 |
| 9,130,057 B1 * | 9/2015 | Kumar | B26D 9/00 |

(Continued)

FOREIGN PATENT DOCUMENTS

| | | |
|---|---|---|
| JP | 2002192370 A | 7/2002 |
| JP | 2005184032 A | 7/2005 |
| JP | 2010050214 A | 3/2010 |

*Primary Examiner* — Bradley Smith
*Assistant Examiner* — David J Goodwin
(74) *Attorney, Agent, or Firm* — Greer Burns & Crain, Ltd.

(57) ABSTRACT

A wafer processing method includes: cutting a device layer stacked on a semiconductor substrate along division lines to form cut grooves; positioning a focal point of a laser beam having a transmission wavelength to the semiconductor substrate inside an area of the semiconductor substrate corresponding to a predetermined one of the division lines and applying the laser beam to the wafer from a back surface of the wafer, thereby forming a plurality of modified layers inside the wafer along all of the division lines; and grinding the back surface of the wafer to be thinned, causing a crack to grow from each of the modified layers formed inside the area of the semiconductor substrate corresponding to the predetermined one of the division lines to the front surface side of the wafer, thereby dividing the wafer into individual device chips.

3 Claims, 6 Drawing Sheets

(56) References Cited

U.S. PATENT DOCUMENTS

| | | | |
|---|---|---|---|
| 9,453,820 B2* | 9/2016 | Masada | G01N 29/07 |
| 9,620,415 B2* | 4/2017 | Hirata | H01L 23/544 |
| 9,786,490 B2* | 10/2017 | Harada | H01L 21/02115 |
| 9,812,361 B2* | 11/2017 | Buenning | H01L 21/6835 |
| 2004/0266138 A1* | 12/2004 | Kajiyama | H01L 21/78 |
| | | | 438/462 |
| 2009/0280622 A1* | 11/2009 | Genda | H01L 21/78 |
| | | | 438/462 |
| 2014/0145294 A1* | 5/2014 | Moeller | H01L 21/78 |
| | | | 257/499 |
| 2017/0047221 A1* | 2/2017 | Harada | H01L 21/02115 |
| 2017/0053829 A1* | 2/2017 | Hirata | H01L 21/0475 |
| 2019/0164784 A1* | 5/2019 | Wongratanaporngoorn | |
| | | | H01L 21/78 |

* cited by examiner

WAFER PROCESSING METHOD

BACKGROUND OF THE INVENTION

Field of the Invention

The present invention relates to a wafer processing method of dividing a wafer into individual chips, the wafer having a device layer stacked on a front surface of a semiconductor substrate.

Description of the Related Art

A wafer having a device layer stacked on a semiconductor substrate is partitioned into separate regions along a plurality of crossing division lines in a grid pattern on a front surface thereof, and a plurality of devices such as integrated circuits (IC) and large-scale integrations (LSI) are formed in the respective regions in the device layer. Such wafer is divided into individual device chips using a dicing apparatus, a laser processing apparatus, or the like. The device chips thus divided are used in electric equipment such as a mobile phone or a personal computer.

A dicing apparatus cuts a wafer along a plurality of division lines formed on a front surface of the wafer by cutting means rotatably provided with a cutting blade, thereby dividing the wafer into individual device chips with high accuracy (for example, see Japanese Patent Laid-open No. 2010-050214).

A laser processing apparatus irradiates the wafer with a laser beam of a transmission wavelength to a semiconductor substrate with a focal point of the laser beam positioned inside an area corresponding to a predetermined one of the division lines, thereby continuously forming modified layers inside the wafer along all of the division lines (for example, see Japanese Patent No. 3408805).

When the wafer is divided into individual device chips after modified layers are formed by the laser processing apparatus, a protective member is provided on the front surface of the wafer, and the wafer is held on a chuck table. Then, a back surface of the wafer is ground to reduce a thickness of the wafer, while at the same time, causing a crack to grow from the modified layer formed inside the semiconductor substrate corresponding to the division line to the front surface side of the wafer, so that the wafer is divided into individual device chips (for example, see Japanese Patent No. 4358762).

SUMMARY OF THE INVENTION

In a case in which the wafer is cut by the dicing apparatus described above and divided into individual device chip, a die strength of the divided device chip may be reduced. In addition, in a case in which the modified layer is formed inside the wafer in an area corresponding to each division line by the above-described laser processing apparatus and the back surface of the wafer is ground to cause a crack to thereby divide the wafer into individual device chips, a die strength of each device chip is improved compared to a case in which the wafer is divided by dicing. However, in a case in which a device layer stacked on the front surface of the semiconductor substrate is formed to be 20 to 30 μm, which is relatively thick, a crack extending from the semiconductor substrate may not reach the front surface of the device layer, thereby causing a region which is not completely divided to be generated. Further, when a load to be applied to the wafer in grinding is increased in such a way as to cause a crack generated from the modified layer as a start point to forcedly reach the front surface of the device layer, each device chip divided has an irregular shape, thereby causing degradation in quality of each device chip.

It is therefore an object of the present invention to provide a wafer processing method which prevents a shape of each device chip from being irregular while securing a die strength of each device chip.

In accordance with an aspect of the present invention, there is provided a wafer processing method of dividing a wafer into individual device chips, the wafer having a device layer being stacked on a front surface of a semiconductor substrate, the device layer having a plurality of devices individually formed in a plurality of regions partitioned by a plurality of crossing division lines on a front surface of the wafer. The wafer processing method includes: a cut groove forming step of positioning a cutting blade on the front surface of the wafer, and cutting the device layer along each of the division lines to form a cut groove; a modified layer forming step of positioning a focal point of a laser beam having a transmission wavelength to the semiconductor substrate inside an area of the semiconductor substrate corresponding to a predetermined one of the division lines and applying the laser beam to the wafer from a back surface of the wafer, thereby forming a plurality of modified layers inside the wafer along all of the division lines; a protective member providing step of providing a protective member on the front surface of the wafer before or after the modified layer forming step is carried out; and a dividing step of holding the wafer on a chuck table in a condition in which a front surface side of the wafer provided with the protective member is placed on the chuck table, grinding the back surface of the wafer to be thinned, and causing a crack to grow from each of the modified layers formed inside the area of the semiconductor substrate corresponding to the predetermined one of the division lines to the front surface side of the wafer, thereby dividing the wafer into individual device chips.

Preferably, the wafer processing method further includes a frame supporting step of attaching a dicing tape on the back surface of the wafer, supporting the wafer through the dicing tape with an annular frame having an opening for accommodating the wafer therein, and peeling off the protective member from the front surface of the wafer, after the dividing step is carried out, and a pickup step of expanding the dicing tape to increase each interval between any adjacent ones of the individual device chips, and picking up each of the device chips after the frame supporting step is carried out.

According to the wafer processing method of the present invention, a die strength of each device chip is improved. In addition, the device layer is cut with the cutting blade to form the cut grooves, and in the dividing step, each crack to grow from the modified layer is accordingly guided by each cut groove formed in the front surface of the wafer, so that the wafer is securely divided into individual device chips. At the same time, since the shape of the device chip is formed in accordance with the cut groove, the device chip does not have an irregular shape. Hence, degradation in quality of device chips is not caused.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
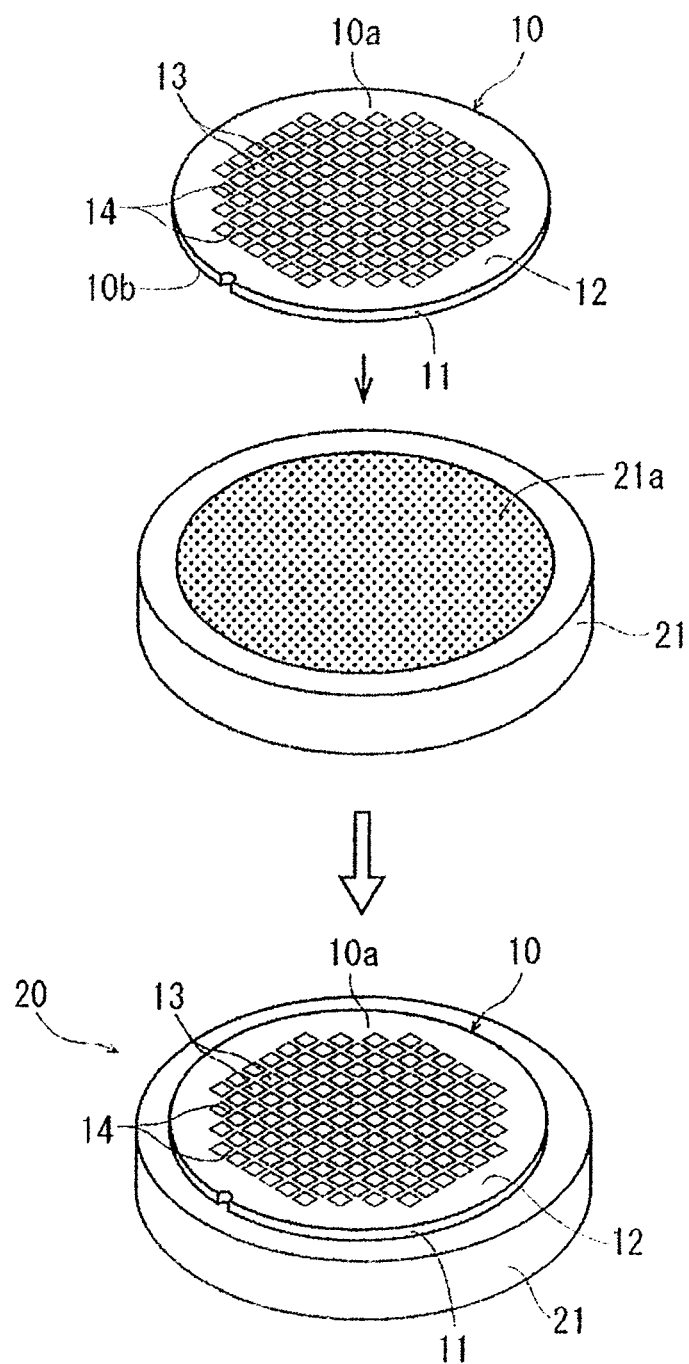
FIG. 1 is a perspective view illustrating a manner in which a wafer is held on a holding table of a cutting apparatus in carrying out a cut groove forming step in a wafer processing method according to a preferred embodiment of the present invention.

A preferred embodiment of a wafer processing method according to the present invention will be described in detail below with reference to the attached drawings. Upon carrying out the wafer processing method according to the present embodiment, first, a wafer 10 as a workpiece is prepared. As illustrated in FIG. 1, the wafer 10 to be processed in the present embodiment includes a semiconductor substrate 11 and a device layer 12 stacked thereon. More specifically, the device layer 12 is stacked on a front surface of the semiconductor substrate 11 composed of silicon (Si), for example, and a plurality of devices 13 in the device layer 12 are partitioned by a plurality of crossing division lines 14 formed on a front side of the wafer 10. The semiconductor substrate 11 has a thickness of 100 µm. The device layer 12 has a thickness of 30 µm. Accordingly, a total thickness of the wafer 10 is 130 µm. The wafer 10 has a front surface 10a on a side on which the device layer 12 is formed is of the wafer 10, and a back surface 10b on a side opposite to the front surface 10a.

When the wafer 10 is prepared, a cut groove forming step of forming a cut groove by cutting the device layer 12 of the wafer 10 along each of the division lines 14 is next carried out. A description of the cut groove forming step will be given below.

(Cut Groove Forming Step)

Upon carrying out the cut groove forming step, the wafer 10 is transferred to a holding table 21 of a dicing apparatus 20 (partly illustrated) illustrated in FIG. 1 and placed on a suction chuck 21a of the holding table 21 such that the back surface 10b of the wafer 10 is oriented downward. Suction means not illustrated is connected to the holding table 21, and the suction means is operated, so that the wafer 10 is held and sucked through the suction chuck 21a having gas permeability on the holding table 21.

Figure 2:
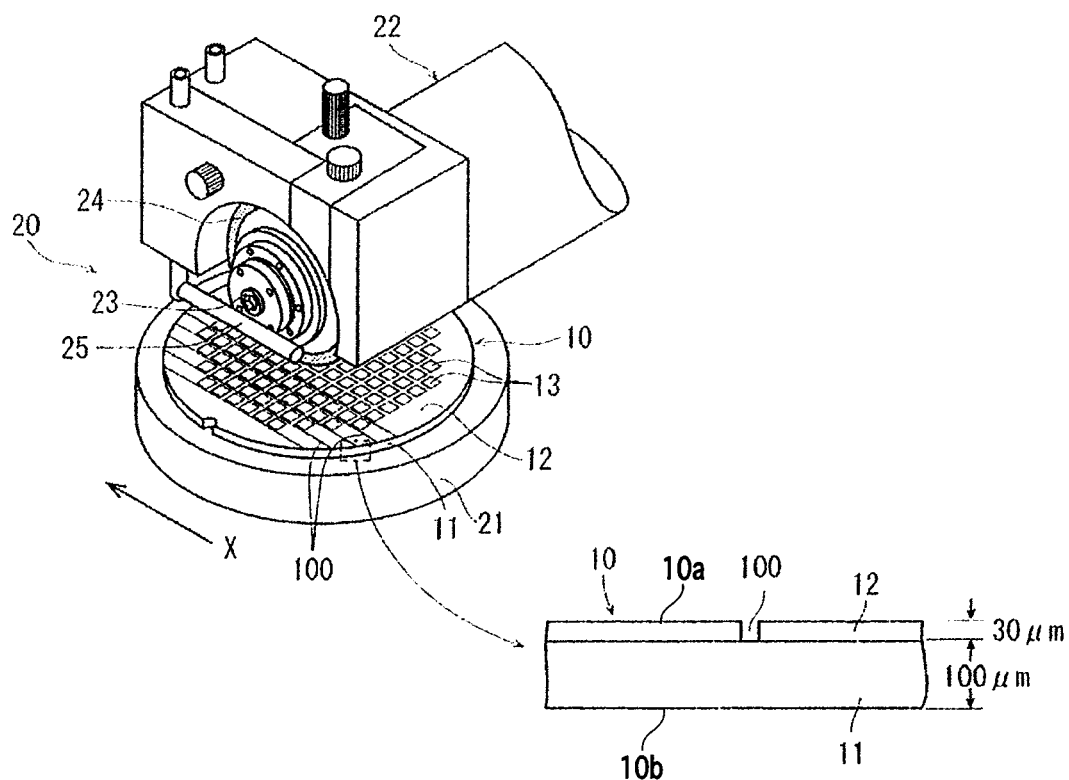
FIG. 2 is a perspective view illustrating a manner of the cut groove forming step in the wafer processing method according to the preferred embodiment, in which a dashed rectangle is an enlarged partial side view of an end portion (peripheral portion) of the wafer held on the holding table.

As illustrated in FIG. 2, the dicing apparatus 20 includes a spindle unit 22 as cutting means. The spindle unit 22 is mounted on a moving base not illustrated and is adjustable to move in an indexing feed direction (a direction perpendicular to a processing feed direction X on a horizontal plane) and a cut depth direction (vertical direction). Also, the spindle unit 22 has a spindle 23 rotatably supported thereto, the spindle 23 being driven to be rotated by a rotational drive mechanism (not illustrated). The spindle 23 has a cutting blade 24 fixed at a distal end portion thereof. In addition, a pair of cutting water supply pipes 25 supplying cut water toward a processed position to be processed by the cutting blade 24 is provided on opposite sides of the cutting blade 24. The cutting blade 24 is, for example, formed by fixing diamond abrasive grains with a metal bond or the like, and is 50 mm in diameter and 30 µm in thickness.

After the wafer 10 is held under suction on the holding table 21 of the dicing apparatus 20, positioning (alignment) between the division lines 14 formed on the front surface 10a of the wafer 10 and the cutting blade 24 is performed using alignment means including an imaging camera or the like (not illustrated) provided in the dicing apparatus 20.

After the alignment described above is finished, the cutting blade 24 is positioned above an end portion of the wafer 10 serving as a processing start position on a predetermined one of the division lines 14, and the rotational drive mechanism (not illustrated) is operated to rotate the cutting blade 24 with the spindle 23. The cutting blade 24 is rotated at a rotational speed of 40,000 rpm, for example, by the rotational drive mechanism, while being lowered to the wafer 10 in such a way as to cut in the device layer 12 from the front surface 10a of the wafer 10. Then, the cutting blade 24 is cutting-fed to cut the device layer 12 at a depth of 30 µm to be removed. Note that a value of a depth of cut in cutting-feeding is set according to a thickness of the device layer 12 formed on the front surface 10a of the wafer 10. However, this is not necessarily limited to removal of the entire device layer 12. As a modification, the value of the depth of cut in cutting-feeding may be set to substantially 20 µm to be removed, for example, so that the device layer 12 may have a thickness of substantially 10 µm left.

While cutting-feeding the cutting blade 24 to cut in the device layer 12 from the front surface 10a of the wafer 10 to a depth of 30 µm, the holding table 21 is processing-fed at a speed of 30 mm/s, for example, in a direction indicated by an arrow X in FIG. 2 at the same time. As a result, the device layer 12 stacked on a predetermined one of the division lines 14 is cut, thereby forming a cut groove 100 having a depth of 30 µm as illustrated in a dashed rectangle in FIG. 2 as an enlarged partial side view of the end portion (peripheral portion) of the wafer 10. After forming the cut groove 100 along the predetermined one of the division lines 14, the cutting blade 24 is indexing-fed above another one of the division lines 14 where the cut groove 100 has not been formed yet and adjacent to the division line 14 where the cut groove 100 has been formed. Then, the similar cutting processing is performed, so that another cut groove 100 is formed. In this manner, the cut grooves 100 are formed corresponding to all of the division lines 14 extending in a first direction. After that, the holding table 21 is rotated at 90°, and the similar cutting processing is performed for the division lines 14 extending in a second direction perpendicular to the division lines 14 where the cut grooves 100 has been formed earlier in the first direction. As a result, the cut grooves 100 each having a depth of 30 μm and a width of 30 μm are formed along all of the division lines 14. As described above, the cut groove forming step is completed. After the cut groove forming step is completed, a protective member providing step and a modified layer forming step described below will be carried out.

(Protective Member Providing Step)

Figure 3:
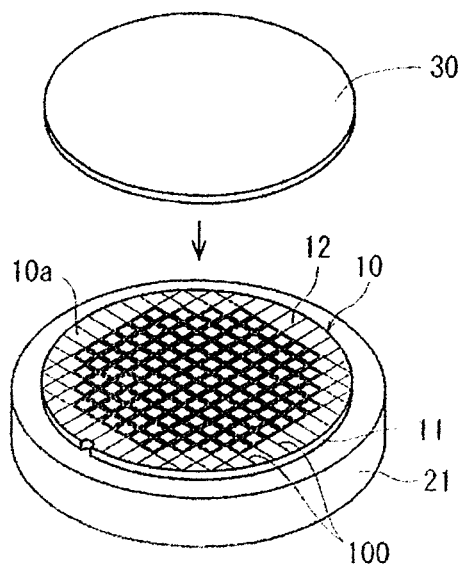
FIG. 3 is a perspective view illustrating a manner of a protective member providing step in the wafer processing method according to the preferred embodiment.

After the cut groove forming step is performed on the wafer 10 and the cut grooves 100 are formed along all of the division lines 14 on the wafer 10, as illustrated in FIG. 3, a protective tape 30 serving as a protective member which protects the device layer 12 formed on the front surface 10a side of the wafer 10 is provided on the wafer 10. The protective tape 30 to be used here may be formed by coating an adhesive formed of acrylic resin on a front surface of a sheet-like base material composed of a polyvinyl chloride (PVC) with the same shape as the wafer 10. The protective member providing step is carried out on the holding table 21 of the dicing apparatus 20 where the cut groove forming step has been carried out. In this manner, the protective member providing step is completed, and then, the wafer 10 is transferred to a subsequent step in which the modified layer forming step is carried out.

(Modified Layer Forming Step)

Figure 4:
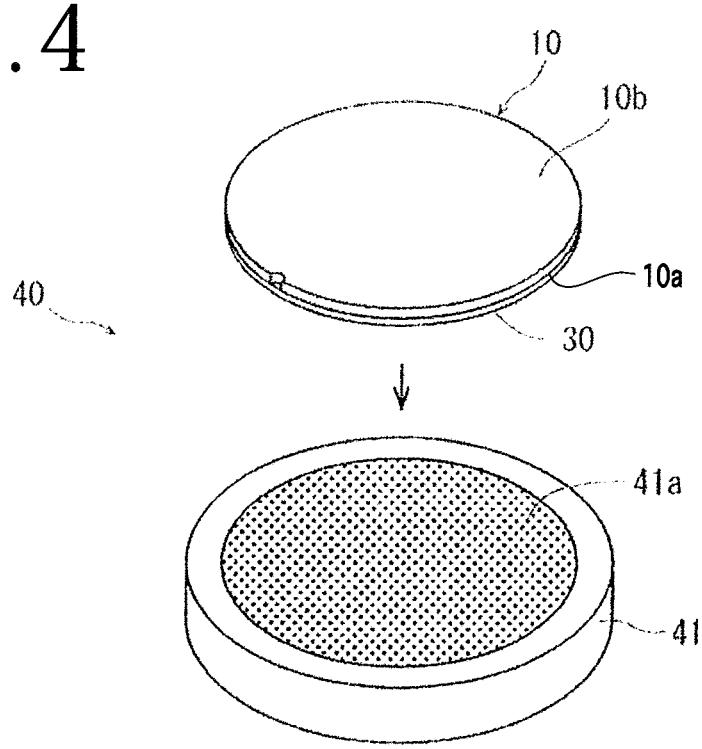
FIG. 4 is a perspective view illustrating a manner of placing the wafer on a holding table of a laser processing apparatus for carrying out a modified layer forming step in the wafer processing method according to the preferred embodiment.

In the modified layer forming step, the wafer 10 being subjected to the protective member providing step is unloaded from the holding table 21 and transferred to a laser processing apparatus 40 (partly illustrated) illustrated in FIG. 4. The wafer 10 is placed on a suction chuck 41a of a holding table 41 provided in the laser processing apparatus 40 such that the protective tape 30 is oriented downward. In other words, the wafer 10 is placed on the suction chuck 41a of the holding table 41 such that the back surface 10b of the wafer 10 is oriented upward. After the wafer 10 is placed on the suction chuck 41a, suction means (not illustrated) connected to the holding table 41 is operated to hold and suck the wafer 10 on the suction chuck 41a of the holding table 41.

Figure 5:
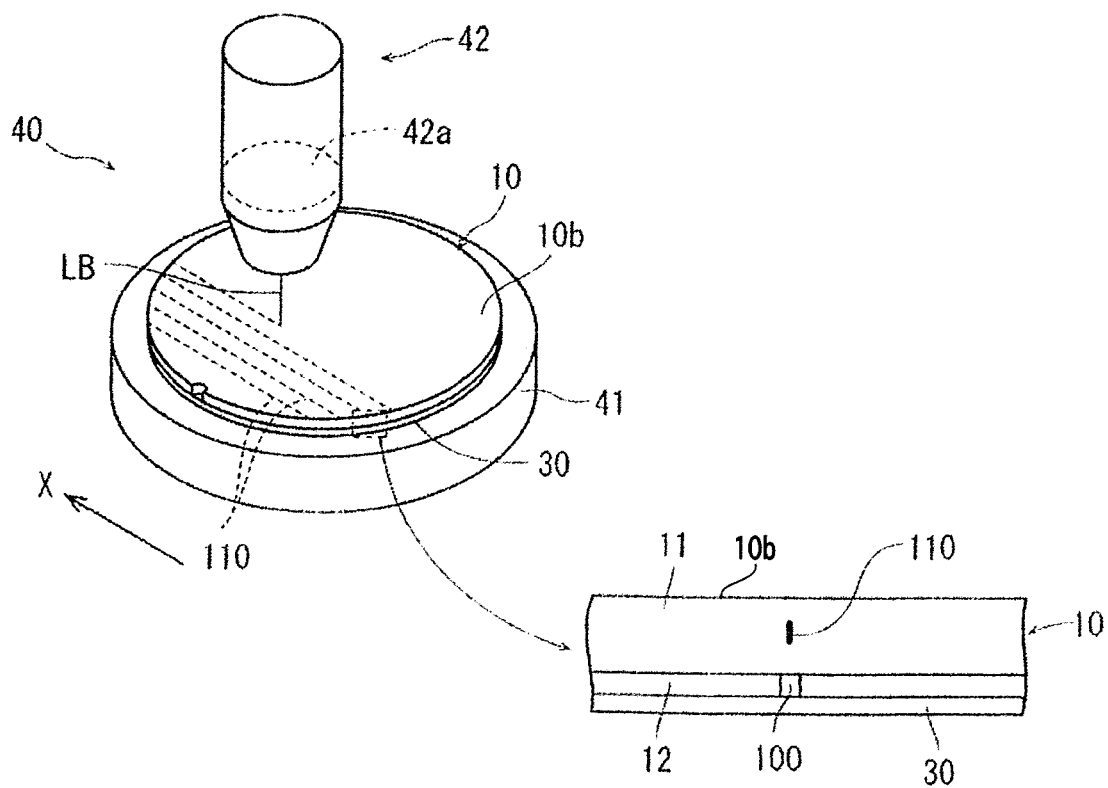
FIG. 5 is a perspective view illustrating a manner of carrying out the modified layer forming step, in which a dashed rectangle is an enlarged partial side view of an end portion (peripheral portion) of the wafer held on the holding table.

As illustrated in FIG. 5, the laser processing apparatus 40 includes a laser beam applying unit 42 (partly illustrated) therein. The laser beam applying unit 42 includes a laser oscillator (not illustrated) oscillating a laser beam of a desired wavelength therein. The laser oscillator emits a laser beam LB toward the wafer 10 held on the holding table 41, and the laser beam LB passes through a focusing lens 42a to be focused, so that the laser beam LB thus focused can be applied to the wafer 10. Note that, although illustration is omitted, the laser processing apparatus 40 includes therein infrared light applying means capable of imaging the front surface 10a side of the wafer 10 after an infrared ray emitted therefrom passes through the semiconductor substrate 11, and alignment means including an infrared imaging camera or the like.

After the wafer 10 is held on the holding table 41 of the laser processing apparatus 40, the alignment means described above performs positioning (alignment) between a position corresponding to a predetermined one of the division lines 14 formed from the back surface 10b of the wafer 10 held under suction on the holding table 41 to the front surface 10a of the wafer 10 and an irradiation position of the laser beam LB.

After finishing the alignment described above, the laser beam applying unit 42 is positioned above an end portion of the wafer 10 serving as a processing start position on the predetermined one of the division lines 14, and a focal point of the laser beam LB is positioned at a subject area to be divided inside the semiconductor substrate 11 corresponding to the predetermined one of the division lines 14. After the focal point of the laser beam LB is positioned at the subject area to be divided inside the semiconductor substrate 11, as illustrated in FIG. 5, the holding table 41 is processing-fed in the direction indicated by the arrow X. Then, the laser beam applying unit 42 irradiates the subject area to be divided inside the semiconductor substrate 11 corresponding to the predetermined one of the division lines 14 with the laser beam LB, and as understood from the partial side view of the end portion of the wafer 10 illustrated in an enlarged manner in a dashed rectangle in FIG. 5, modified layers 110 are continuously formed. After the modified layers 110 are formed, the holding table 41 is moved to a position corresponding to another division line 14 where the modified layers 110 have not been formed yet, adjacent to the division line 14 where the modified layers 110 have been already formed, and accordingly, the laser beam applying unit 42 is indexing-fed, thereby carrying out the similar laser processing. As a result, the modified layers 110 are formed along the division lines 14. In this manner, when the modified layers 110 are continuously formed inside the semiconductor substrates 11 corresponding to all of the division lines 14 extending in the first direction, the holding table 41 is rotated at 90°. Then, similar laser processing is performed also on subject areas to be divided inside the semiconductor substrate 11 corresponding to the division lines 14 extending in the second direction perpendicular to the division lines 14 along which the modified layers 110 have been formed earlier, and as a result, the modified layers 110 are continuously formed inside the semiconductor substrate 11 along all of the division lines 14.

As understood from FIG. 5, the modified layer 110 is formed along the cut groove 100 which has been formed earlier. Accordingly, the cut groove 100 and the modified layer 110 are formed along each division line 14 in the vertical direction. Note that it is not limited that the modified layer 110 is formed by one shot of irradiation of the laser beam LB along each division line 14. Alternatively, the position of the focal point of the laser beam LB inside the semiconductor substrate 11 may be slightly shifted in the vertical direction, being applied a plurality of times, so that the modified layer 110 may be formed so as to have a predetermined width in a depth direction. As described above, the modified layer forming step is completed, and the dividing step described below is next carried out.

Note that a laser processing condition in the modified layer forming step described above is set as follows, for example.
Wavelength: 1342 nm
Repetitive frequency: 60 kHz
Average output power: 1 W
Processing feed speed: 600 mm/s (Dividing Step)

After the modified layer forming step described above is completed, the suction means connected to the holding table 41 of the laser processing apparatus 40 is stopped, and the wafer 10 formed with the modified layers 110 inside the wafer 10 along all of the division lines 14 is unloaded. The wafer 10 unloaded from the holding table 41 is transferred to a grinding apparatus 50 illustrated in FIG. 6A. The wafer 10 transferred to the grinding apparatus 50 is placed on a chuck table 51 provided in the grinding apparatus 50 in a condition in which the protective sheet 30 is oriented downward. The chuck table 51 has suction means (not illustrated) connected thereto, and the suction means is operated, so that the wafer 10 is held under suction on the chuck table 51.

The grinding apparatus 50 includes a grinding unit 52 for grinding the wafer 10 held under suction on the chuck table 51 to reduce in thickness. The grinding unit 52 includes a spindle 521, a mounter 522, and a grinding wheel 523. The spindle 521 is rotated by a rotational drive mechanism (not illustrated). The mounter 522 is mounted to a lower end of the spindle 521. The grinding wheel 523 is attached on a lower surface of the mounter 522 and has grinding stones 524 in an annular manner provided on a lower surface of the grinding wheel 523.

Figure 6A:
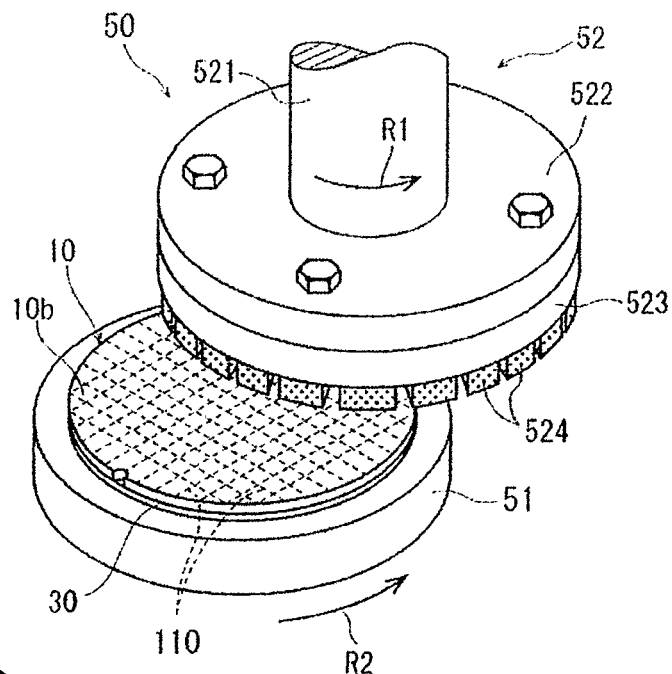
FIG. 6A is a perspective view illustrating a manner of carrying out a dividing step in the wafer processing method according to the preferred embodiment.
Figure 6B:
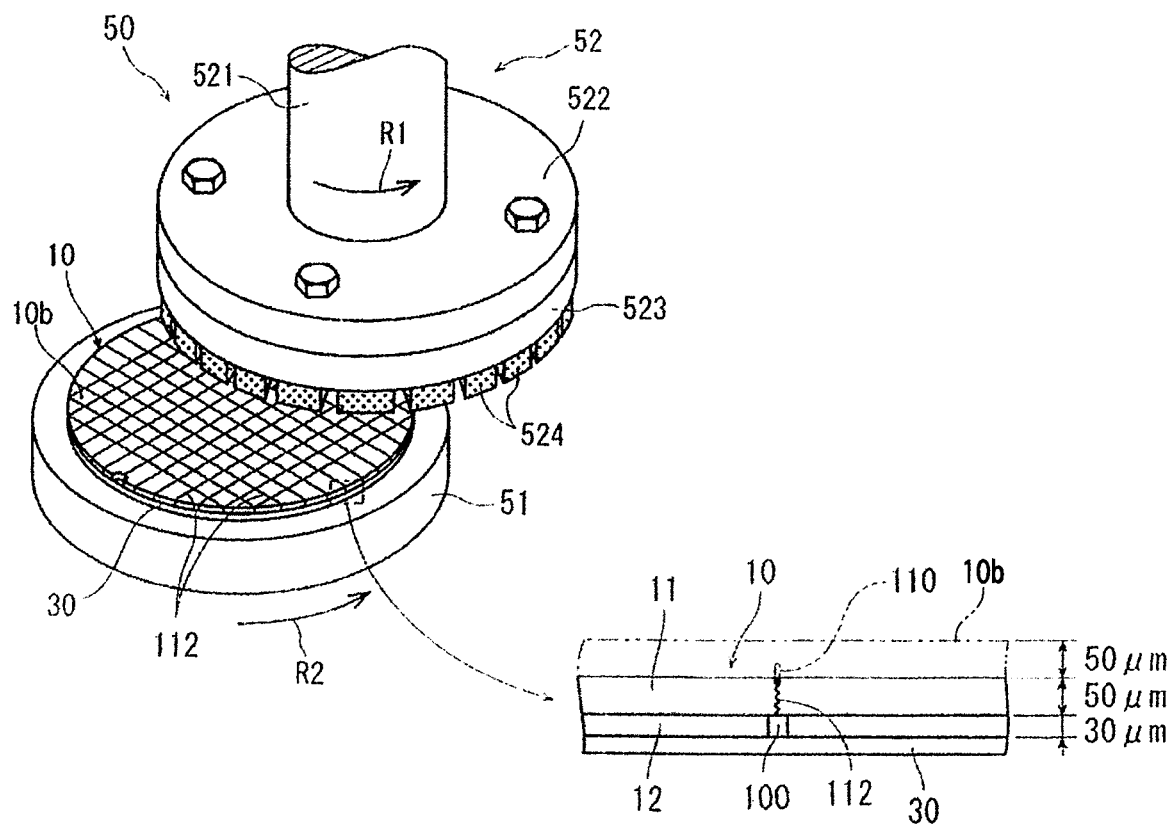
FIG. 6B is a perspective view illustrating a state in which the wafer is divided into individual device chips by carrying out the dividing step, in which a dashed rectangle is an enlarged partial side view of an end portion (peripheral portion) of the wafer held on the holding table.

When the wafer 10 is held under suction on the chuck table 51, the spindle 521 of the grinding unit 52 is rotated in a direction indicated by an arrow R1 in FIG. 6A at 3000 rpm, for example, while at the same time, the chuck table 51 is rotated in a direction indicated by an arrow R2 in FIG. 6A at 300 rpm, for example. Then, the grinding stones 524 is brought into contact with the back surface 10b of the wafer 10, and the grinding wheel 523 supporting the grinding stones 524 is grinding-fed in a downward direction at a grinding feed speed of 1 µm/s, for example. At this time, grinding can be proceeded measuring a thickness of the wafer 10 with a contact-type measuring gauge (not illustrated). Then, as illustrated in FIG. 6B, when the back surface 10b of the wafer 10 is ground by 50 µm (more specifically, the semiconductor substrate 11 is ground from the back surface 10b side of the wafer 10 to be thinned to 50 µm), so that the wafer 10 is thinned to a predetermined thickness, for example, 80 µm (50 µm of the semiconductor substrate 11+30 µm of the device layer 12). As a result, the grinding unit 52 is stopped. By carrying out this grinding processing, as a region of part of the side surface of the wafer 10 is illustrated in an enlarged manner in a dashed rectangle in FIG. 6B, the crack generated in the process of thinning the wafer 10 reaches the cut groove 100 from the modified layer 110, thereby forming a dividing line 112. In this manner, the wafer 10 is securely divided along the division lines 14, and a shape of each device chip 13' is formed in accordance with the cut groove 100. Thus, each device chip 13' does not have an irregular shape, and accordingly, degradation in quality is prevented. Hence, the dividing step is completed.

In the present embodiment, taking into consideration that the wafer 10 divided into the individual device chips 13' is accommodated into a predetermined cassette case and each of the device chips 13' is picked up to be transferred to a subsequent step, after the dividing step described above is carried out, a frame supporting step and a pickup step is carried out. Herein under, the frame supporting step and the pickup step will be described with reference to FIG. 7A to FIG. 8.

(Frame Supporting Step)

Figure 7A:
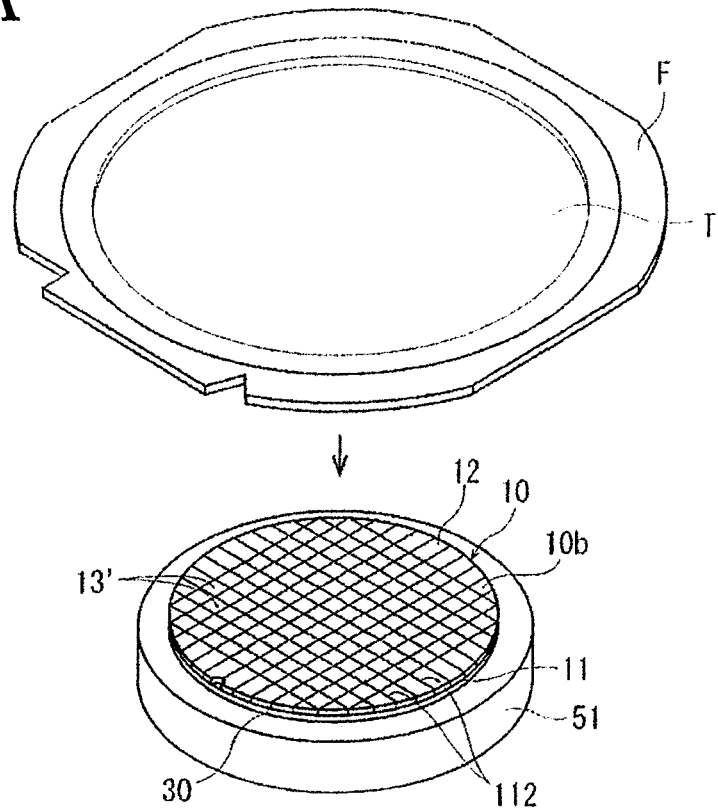
FIG. 7A is a perspective view illustrating a manner in which the wafer is supported through a protective tape by an annular frame in a frame supporting step in the wafer processing method according to the preferred embodiment.
Figure 7B:
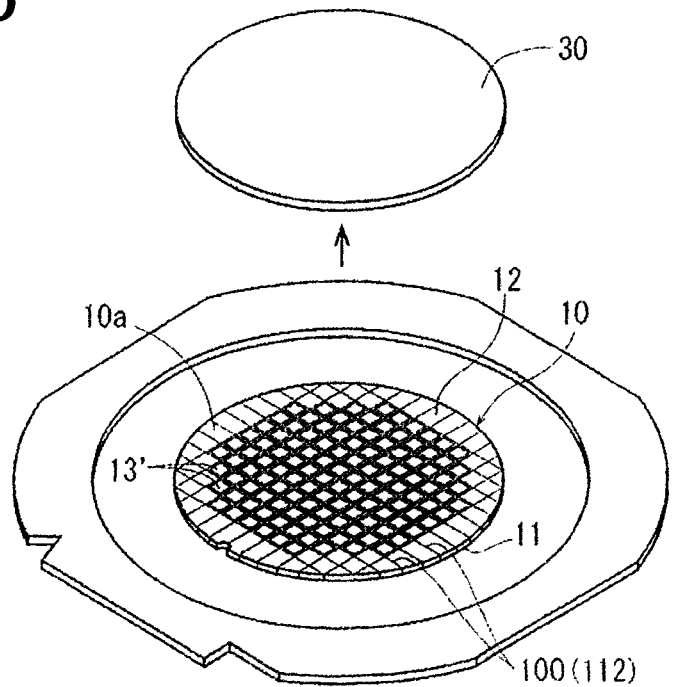
FIG. 7B is a perspective view illustrating a manner in which the protective tape is peeled off from the wafer supported by the annular frame.

Through the dividing step described above, the wafer 10 held under suction on the chuck table 51 has the back surface 10b thereof exposed upward as understood in FIG. 7A. In the present embodiment, as illustrated in FIG. 7A, an annular frame F having an opening set to a size capable of accommodating the wafer 10 therein is prepared. Also, a circular dicing tape T having an outer periphery larger than the size of the opening of the frame F is prepared. Then, the outer periphery of the dicing tape T is attached to the frame F, and the wafer 10 held on the chuck table 51 is positioned at the center of the opening, and the back surface 10b of the wafer 10 is attached to the center of the dicing tape T. Then, the suction means (not illustrated) connected to the chuck table 51 is stopped, so that the wafer 10 is detached from the chuck table 51 along with the frame F, thereby allowing the wafer 10 to be supported by the frame F through the dicing tape T. Then, as illustrated in FIG. 7B, the wafer 10 with the frame F and the dicing tape T is reversed such that the front surface 10a of the wafer 10 is oriented upward. Then, the protective tape 30 attached to the front surface 10a of the wafer 10 is peeled off from the front surface 10a of the wafer 10. As a result, the frame supporting step is completed. In this manner, even after the wafer 10 is divided into the individual device chips 13' along the cut grooves 100 and the dividing lines 112, it is possible to accommodate the wafer 10 into a cassette case not illustrated and transfer the wafer 10 to a pickup apparatus etc. which carries out the pickup step described later in a condition in which the form of the whole wafer 10 is maintained.

(Pickup Step)

Figure 8:
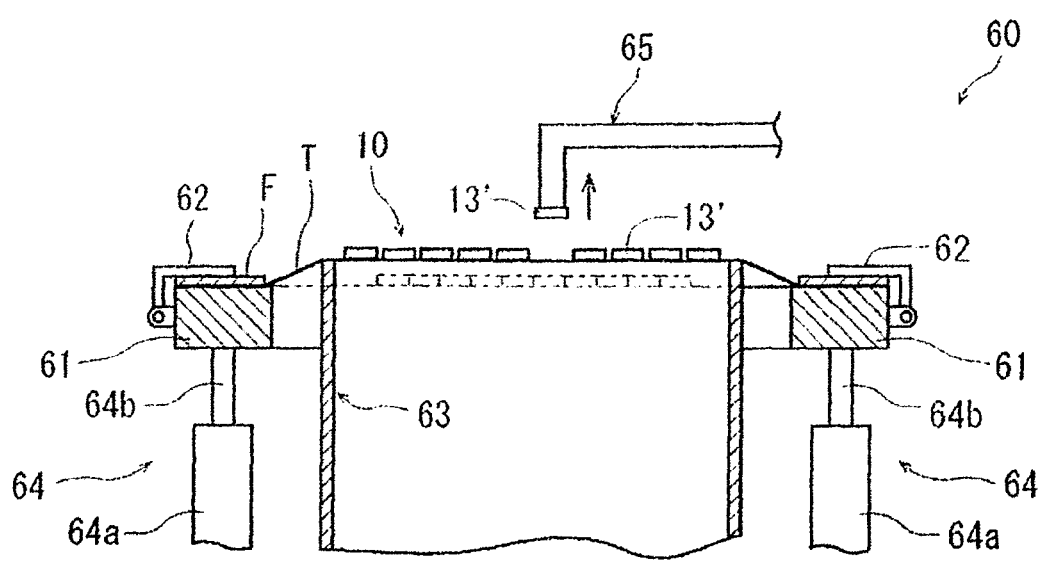
FIG. 8 is a perspective view illustrating a manner of a pickup step in the wafer processing method according to the preferred embodiment.

After the frame supporting step is carried out, the wafer 10 is transferred to a pickup apparatus 60 illustrated in FIG. 8. The pickup apparatus 60 includes a frame holding member 61, a plurality of clamps 62, an expanding drum 63, supporting means 64, and a pickup collet 65. The frame holding member 61 is configured in such a way as to be movable in the vertical direction. The plurality of clamps 62 holds the frame F placed on an upper surface of the frame holding member 61. The expanding drum 63 has a cylindrical shape with at least an upper end thereof is opened and increases intervals between any adjacent ones of the individual device chips 13' of the wafer 10 mounted to the frame F held by the clamps 62 through the dicing tape T. The supporting means 64 includes a plurality of air cylinders 64a disposed so as to surround the expanding drum 63, and a plurality of piston rods 64b extending from the respective air cylinders 64a. The pickup collet 65 has suction means (not illustrated) connected thereto.

The expanding drum 63 has an outer diameter smaller than an inner diameter of the frame F and larger than an outer diameter of the wafer 10 attached on the dicing tape T mounted to the frame F. In this case, as illustrated in FIG. 8, the pickup apparatus 60 can adjust positioning of the expanding drum 63 such that an upper end portion of the frame holding member 61 and an upper end portion of the expanding drum 63 are substantially equal in height to each other (a position illustrated with a dotted line) and that the upper end portion of the expanding drum 63 is relatively higher than the upper end portion of the frame holding member 61 by causing the frame holding member 61 to be lowered due to operation of the supporting member 64 (a position illustrated with a solid line).

When the frame holding member 61 is lowered to relatively change the position of the upper end portion of the expanding drum 63 such that the upper end portion of the expanding drum 63 is located higher from the position illustrated with the dotted line to the position illustrated with the solid line, the dicing tape T mounted to the frame F is expanded by an edge of the upper end portion of the expanding drum 63. In this case, since the wafer 10 has been subjected to the dividing step described above, the wafer 10 has been already divided into the individual device chips 13'. Accordingly, the dicing tape T is expanded, so that a tensile force (external force) acts radially on the wafer 10, thereby increasing each interval between any adjacent ones of the individual device chips 13'.

As described above, after each interval between any adjacent ones of the individual device chips 13' is increased, the pickup collet 65 is operated to hold each device chip 13' under suction from above by a tip end of the pickup collet 65 in a condition in which each interval between any adjacent ones of the individual device chips 13' is increased, thereby picking up each device chip 13' from the dicing tape T. Each device chip 13' picked up from the dicing tape T is transferred to a subsequent step, or accommodated in a storage case not illustrated. Thus, the pickup step in the present embodiment is completed, and accordingly, the wafer processing in the present embodiment is completed. Note that a dimension in each figure illustrating the present embodiment referred to in the foregoing description is appropriately adjusted for convenience in description and does not indicate an actual dimensional ratio.

According to the present invention, the embodiment described above is not limitative, and various modifications are provided. For example, in the embodiment described above, the protective member providing step is carried out before the modified layer forming step is carried out. However, since a sufficiently large external force does not act on the front surface 10a of the wafer 10 in the modified layer forming step, it may be configured such that the protective member providing step is carried out after the modified layer forming step is carried out to be prepared for the grinding step carried out in the dividing step.

Also, it is needless to say that each processing condition of the dicing apparatus, the laser processing apparatus, the grinding apparatus which are carried out in the cut groove forming step, the modified layer forming step, and the dividing step, respectively, is appropriately adjustable depending on a material, a thickness, or the like of a workpiece.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of dividing a wafer into individual device chips, the wafer having a device layer being stacked on a front surface of a semiconductor substrate, the device layer having a plurality of devices individually formed in a plurality of regions partitioned by a plurality of crossing division lines on a front surface of the wafer, the wafer processing method comprising:
   a cut groove forming step of positioning a cutting blade on the front surface of the wafer, and cutting the device layer along each of the division lines to form a cut groove of a depth that is less than a thickness of the device layer such that a portion of the device layer remains between a base of the cut groove and the front surface of the semiconductor substrate, wherein a thickness of the portion of the device layer that remains between the base of the cut groove and the front surface of the semiconductor substrate is approximately 10 µm;
   a modified layer forming step of positioning a focal point of a laser beam having a transmission wavelength to the semiconductor substrate inside an area of the semiconductor substrate corresponding to a predetermined one of the division lines and applying the laser beam to the wafer from a back surface of the wafer, thereby forming a plurality of modified layers inside the wafer along all of the division lines;
   a protective member providing step of providing a protective member on the front surface of the wafer before or after the modified layer forming step is carried out; and
   a dividing step of holding the wafer on a chuck table in a condition in which a front surface side of the wafer provided with the protective member is placed on the chuck table, grinding the back surface of the wafer to be thinned, wherein the grinding causes a crack to grow from each of the modified layers formed inside the area of the semiconductor substrate corresponding to the predetermined one of the division lines to the front surface side of the wafer, thereby dividing the wafer into individual device chips, wherein the grinding of the dividing step is performed after performing the modified layer forming step.

2. The wafer processing method according to claim 1, further comprising:
   a frame supporting step of attaching a dicing tape on the back surface of the wafer, supporting the wafer through the dicing tape with an annular frame having an opening for accommodating the wafer therein, and peeling off the protective member from the front surface of the wafer, after the dividing step is carried out.

3. The wafer processing method according to claim 2, further comprising:
   a pickup step of expanding the dicing tape to increase each interval between any adjacent ones of the individual device chips, and picking up each of the device chips after the frame supporting step is carried out.

\* \* \* \* \*